United States Patent [19]
Namiki et al.

[11] Patent Number: 5,399,936
[45] Date of Patent: Mar. 21, 1995

[54] ORGANIC ELECTROLUMINESCENT DEVICE

[75] Inventors: Tohru Namiki; Hitoshi Satoh; Kenichi Nagayama; Teruichi Watanabe, all of Tsurugashima, Japan

[73] Assignee: Pioneer Electronic Corporation, Tokyo, Japan

[21] Appl. No.: 279,815

[22] Filed: Jul. 25, 1994

Related U.S. Application Data

[63] Continuation of Ser. No. 20,823, Feb. 19, 1993, abandoned.

[30] Foreign Application Priority Data

Apr. 30, 1992 [JP] Japan .................................. 4-111455

[51] Int. Cl.⁶ .............................................. H01J 1/62
[52] U.S. Cl. .................................... 313/504; 313/505; 313/506
[58] Field of Search ............... 313/503, 504, 505, 506; 315/169.3

[56] References Cited

U.S. PATENT DOCUMENTS

| | | | |
|---|---|---|---|
| 4,956,031 | 9/1990 | Mori et al. | 313/506 |
| 5,085,605 | 2/1992 | Itani et al. | 445/25 |
| 5,227,252 | 7/1993 | Murayama et al. | 313/504 |

Primary Examiner—Ulysses Weldon
Assistant Examiner—Doon Chow
Attorney, Agent, or Firm—Fish & Richardson

[57] ABSTRACT

An organic electroluminescent device comprises a cathode, an emitting layer of organic compound including a quinoline derivative, a positive-hole transport layer of organic compound and an anode which are laminated in sequence, further comprising a metal film having a work function equal to or lower than that of the anode and partially disposed between the anode and the positive-hole transport layer. This device achieves a high luminance efficiency per se. The existence of the metal film reduces resistance values of whole anodes. The entering efficiency of the positive-hole carrier is partially decreased due to the metal film line. This metal film line decreases the waste electric current that does not contribute the emission of the emitting layer.

6 Claims, 8 Drawing Sheets

EMISSION

EMISSION

EMISSION

EMISSION

ORGANIC ELECTROLUMINESCENT DEVICE

This is a continuation of application Ser. No. 08/020,823, filed on Feb. 19, 1993, which was abandoned.

BACKGROUND OF THE INVENTION

1. Field of the Invention

The present invention relates to an electroluminescent (EL) device having an emitting layer made of an emitting substance, which utilizes an electroluminescence phenomenon that the emitting substance emits light by applying an electric current to the emitting layer. More particularly, it is concerned with an organic EL device in which the emitting layer is made of an organic emitting substance.

2. Description of the Related Art

As such an EL device type, there have been known a device having two layers each made of an organic compound, as shown in FIG. 1. In this device, an organic fluorescent film or emitting layer 3 and an organic positive-hole transport layer 4 are arranged between a metal electrode or cathode 1 and a transparent electrode or anode 2, the two layers being layered on each other. There have been also known an EL device of three-layer structure, as shown in FIG. 2. In this three-layer device an organic electron transport layer 5, an organic fluorescent film 3 and an organic positive-hole transport layer 4, are arranged between a metal electrode 1 and a transparent electrode 2. The organic positive-hole transport layer 4 has a function to facilitate the injection of positive-holes from the anode as well as another function to block electrons. The organic electron transport layer 5 has a function to facilitate the injection of electrons from the cathode. In these EL devices, where a glass substrate 6 is arranged outside the transparent electrode 2, excitons are generated from the recombination of the electrons injected from the metal electrode 1 with the positive-holes injected to the organic fluorescent film 3 from the transparent electrode 2. At the stage where the excitons are inactivated through radiation, they emit light radiating toward the outside through the transparent electrode 2 and the glass substrate 6. It is known that the emission efficiency of the EL device is improved by rising the entering efficiency of charge carriers with the combination of electrodes of both the transparent anode, made of a conductive material with a high work function, and the cathode, made of a metal with a low work function.

For example, FIG. 3 shows an structure of the two-layer organic EL device of an XY matrix adressing type shown in FIG. 1 which shows a sectional view taken across the line AA' of FIG. 3. This EL device is manufactured in such a manner that a plurality of transparent anode lines 2 made of e.g. indium tin oxide (hereinafter referred as "ITO"), a positive-hole transport layer of organic compound 4, an emitting layer of another organic compound 3 and a plurality of cathode metal lines 1 crossing the anode lines 2, are laminated in sequence on a glass plate 6. The regions crossed by the anode lines 2 and the cathode lines 1 both sandwiching the positive-hole transport layer 4 and the emitting layer 3, emit light with the application of charge carriers. One of the crossed regions corresponds to one pixel of the EL device.

A large size display device constructed with a plurality of XY matrix panels or EL devices having many pixels is driven by supplying an electric current between the anode lines 2 and the cathode lines 1 projecting from the periphery of the panel display.

On the other hand, the luminance efficiency of such an EL device is insufficient for practical use even though it emits at a high efficiency. It is still expected to develop an EL device capable of emission at a further high luminance efficiency, although conventional EL devices can emit light at a lower voltage application. There are problems that when the line resistance value of the transparent anode increases, the consumption electric power of the device increases, and the luminance unevenness on the display surface is conspicuous in proportion to the enlarged size of the display device panel and to the accurately miniatured pixels.

SUMMARY OF THE INVENTION

An object of the present invention is to provide an EL device capable of emission at a high luminance efficiency and of suppressing the increase of line resistance value of the anode.

The gist of the present invention resides in an organic EL device comprising a cathode, an emitting layer of organic compound, a positive-hole transport layer of organic compound and an anode which are laminated in sequence. The device further comprises a metal film having a work function equal to or lower than that of the anode and partially disposed between the anode and the positive-hole transport layer.

The present invention achieves a high luminance efficiency in the EL device, because a metal film line having a low work function is laminated on and along the anode with a high work function in the EL device. Namely, the whole anode including the metal film line has the decreased low resistance value, although the entering efficiency of the positive-hole carrier is partially decreased due to the metal film line having a the lower work function. This metal film line decreases the waste electric current that does not contribute the emission of the emitting layer of light radiating toward the outside.

The present invention will now be explained in detail with reference to accompanying drawings.

DETAILED DESCRIPTION OF PREFERRED EMBODIMENTS

Figure 1:
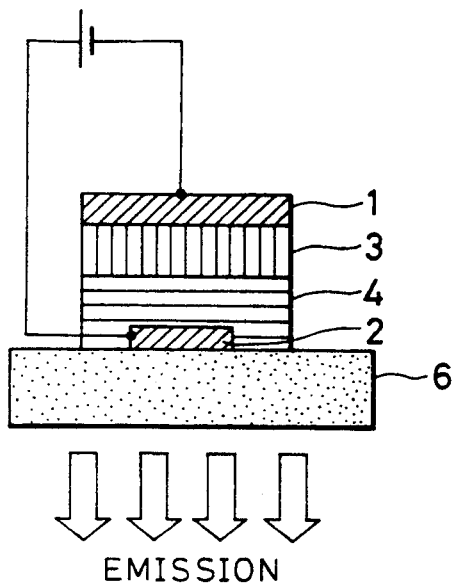
FIG. 1 is a schematic sectional representation showing the two-layer structure of the EL device.
Figure 2:
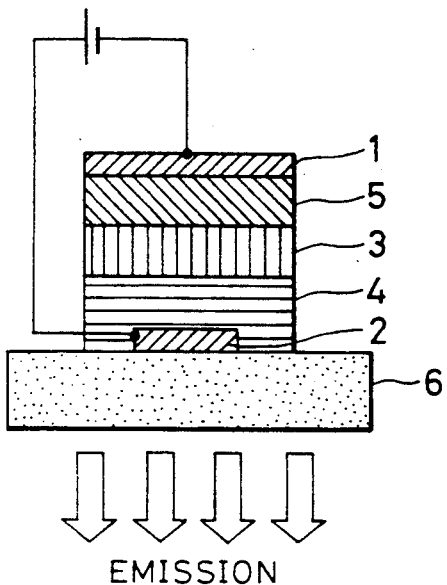
FIG. 2 is a schematic sectional representation showing the three-layer structure of the EL device.
Figure 3:
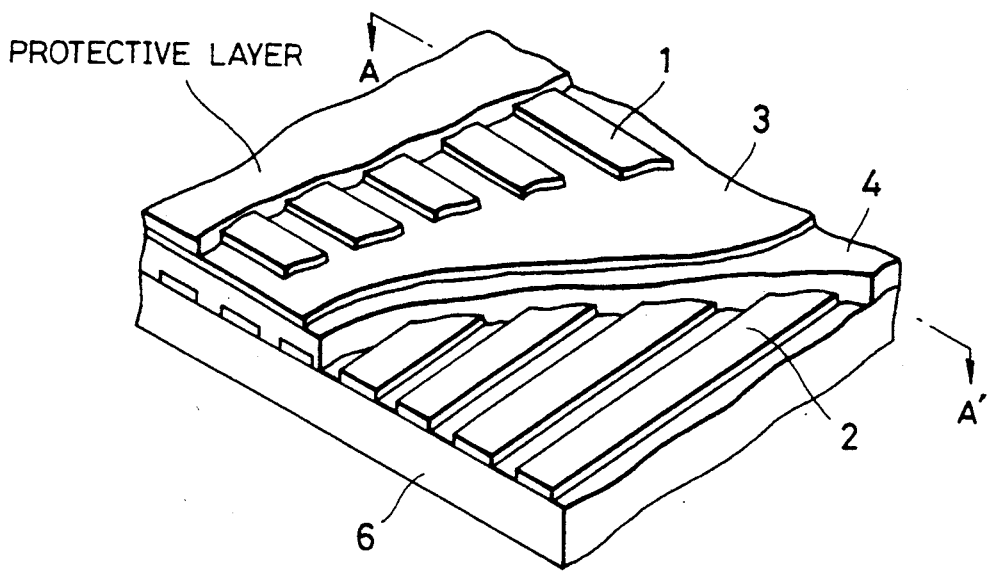
FIG. 3 is a schematic perspective representation, partially cut away of the structure shown in FIG. 1.
Figure 4:
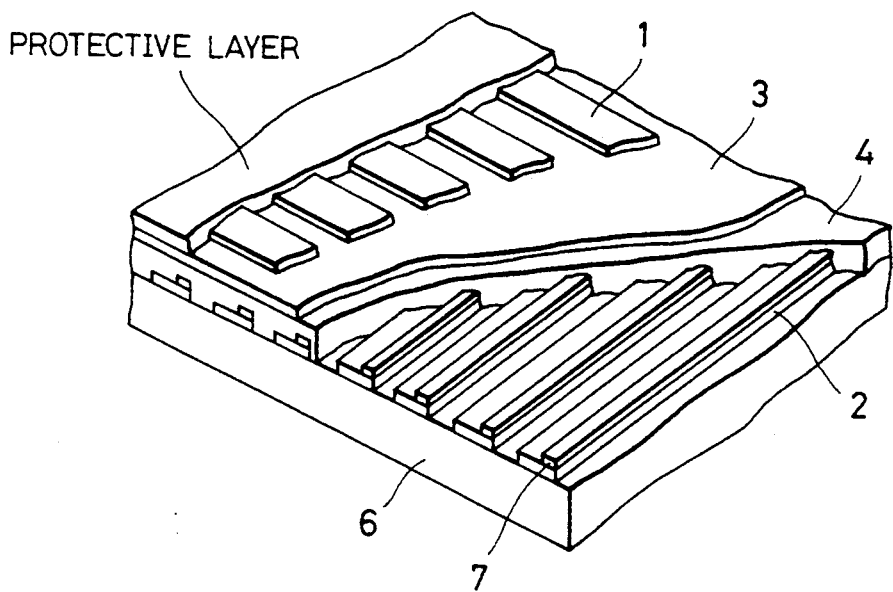
FIG. 4 is a schematic perspective representation partially cut showing an example according to the present invention.
Figure 5:
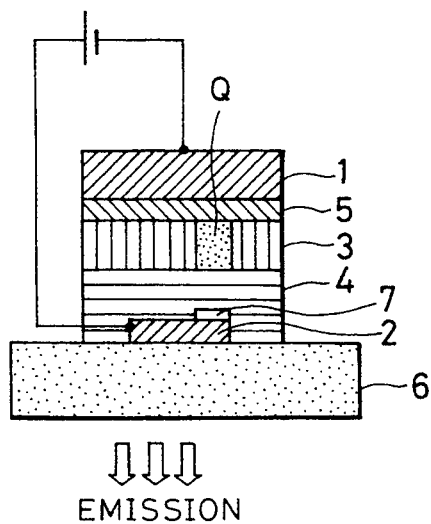
FIG. 5 is a schematic sectional representation showing an example according to the present invention.

An embodiment of an EL device of two-layer type according to the present invention comprises, as shown in FIG. 4, a transparent anode 2, a metal film line 7 having a work function lower than that of the anode, an organic positive-hole transport layer 4, an emitting layer of organic compound 3 and a metallic cathode 1 which are laminated in sequence on a glass transparent substrate 6. In such a two-layer EL device construction, the metal film line 7 is partially laminated between the anode 2 and the positive-hole transport layer 4 without covering all of the anode. Another embodiment of an EL device having a three-layer structure comprises, as shown in FIG. 5, a metal film line 7 having a work function lower than that of the anode, an organic positive-hole transport layer 4, an emitting layer of organic compound 3, an electron transport layer 5 and a metallic cathode 1 which are laminated in sequence on a glass transparent substrate 6. In this way, the metal film line 7 is also partially laminated between the anode 2 and the positive-hole transport layer 4 without covering all of the anode. In the both structures of the device, at least one of the electrodes 1 and 2 may be transparent.

The cathode 1 is made of metal having a comparatively low work function, for example, aluminum, magnesium, indium, silver and an alloy of the individual metals thereof. For example, Al-Li alloy has the work function of about 3.0 eV. The cathode has a thickness of about 100 to 5000 angstroms. The anode 2 is made of a conductive material having a comparatively high work function, for example, ITO (work function=about 5.0 eV) at a thickness of 1000–3000 angstroms. As the anode there may be used Au (its work function=about 5.1 eV) at 800 to 1500 angstroms in thickness. In case the electrode employing gold gets semi-transparent.

The metal film line 7 partially laminated between the anode 2 and the positive-hole transport layer 4 is made of metal having a work function equal to or lower than that of the anode 2 such as aluminum, magnesium, indium, silver and an alloy of the individual metals thereof, which may be used for the cathode 1 as well. In the case that the anode 2 is formed of ITO having a higher work function than that of the metal film line, the metal film line 7 may be formed of alloy of e.g., In-Li, Mg-Sr, or Al-Sr with a work function lower than that of the anode. The work function is defined as a necessary energy (eV) for removing one electron from a surface of a certain metal to a vacuum outside. The work function sensibly changes due to the state of the surface, absorption and/or impurity. For example, work functions of alloy components of the metal film line are listed as: In=about 4.12eV; Li=about 2.9 eV; Mg=about 3.66 eV; Sr=about 2.59 eV; Al=about 4.28 eV; and Ag=about 4.26 eV.

Figure 6A:
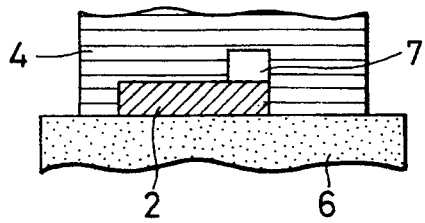
FIGS. 6A–6E are schematic sectional representations showing examples according to the present invention respectively, each metal film line being partially laminated between the anode and the positive-hole transport layer.
Figure 6B:
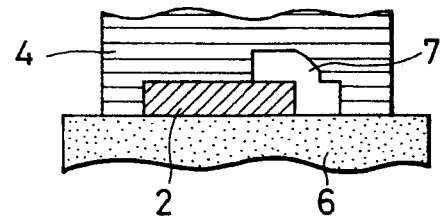
Figure 6C:
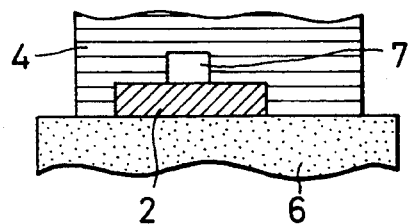
Figure 6D:
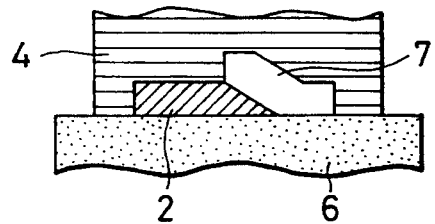
Figure 6E:
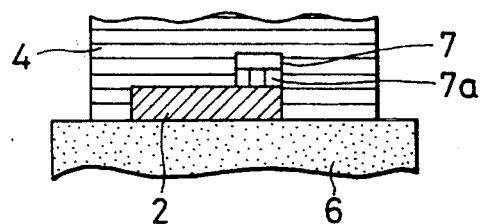

FIGS. 6A–6E show sectional illustrative examples of metal film lines 7 each partially laminated between the anode 2 and the positive-hole transport layer 4 along the extending direction of the anode. FIG. 6A show that the metal film line 7 as shown in FIGS. 4 and 5 is partially laminated along the edge of the anode 2 so as to cover partly the anode 2. FIG. 6B shows that the metal film line 7 partly covers the edge of the anode 2 and the transparent substrate 6. FIG. 6C shows that the metal film line 7 is formed at the center of the anode 2 along the anode. The metal film line 7 may be continuously or intermittently laminated along the extending direction of the anode. As shown in FIGS. 6A–6C, the side wall of the anode 2 is formed perpendicular to the transparent substrate 6 by an anisotropic etching process. FIG. 6D shows that the metal film line 7 is laminated on the ramp surface of the anode 2 which is formed by an isotropic etching process. Particularly, metal film lines 7 are preferably formed of a single metallic component or an alloy of a plurality of metals having a work function equal to or lower than that of the anode to obtain a larger advantageous effect. Furthermore, as shown in FIG. 6E, a second metal film line 7a made of an adhesive metal e.g. Cr, Mo or Ta may be inserted between the metal film line 7 and the anode 2 to improve adhesiveness or affinity therebetween.

The metal film line 7 suppresses the injection of positive-hole carriers from the transparent electrode or anode 2 to the positive-hole transport layer 4, so that the electric current to be supplied to the emitting layer 3 is reduced. Therefore the portion Q of the emitting layer 3 as shown in FIG. 5 hardly emits light. However the other crossed portions of the emitting layer 3 strongly emit light, since the resistance value of the whole anode system of the anode 2 and the metal film line 7 decreases due to the metal film line and increases electric current under a constant voltage.

Figure 7:
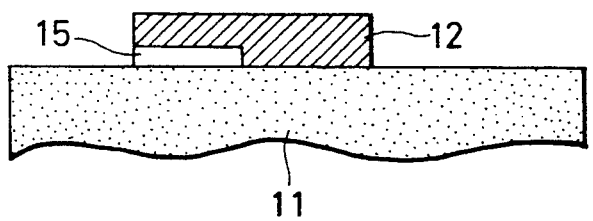
FIG. 7 is a schematic sectional representation showing a substrate supporting a transparent electrode in a flat display device.

A flat display device such as a liquid crystal display, inorganic EL display etc. generally utilizes a substrate having transparent electrodes. In this case, there is probably a problem that the line resistance value of the transparent anode increases in proportion to enlarged size of the display device panel and to an accurately miniatured pixels. To overcome this problem, it is assumed that, as shown in FIG. 7, a metal film line 15 is partly inserted between a transparent substrate 11 and an ITO transparent electrode 12.

Figure 8:
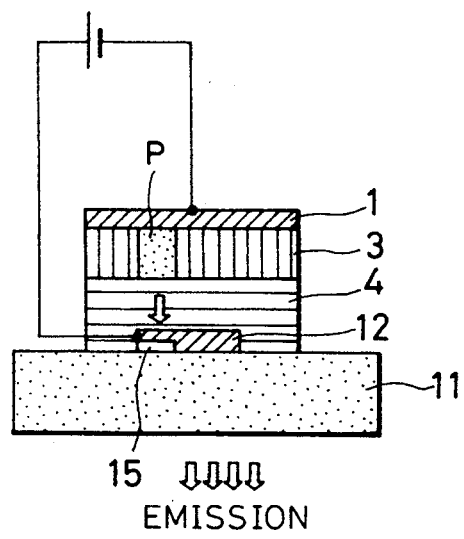
FIG. 8 is a schematic sectional representation of an EL device.
Figure 9:
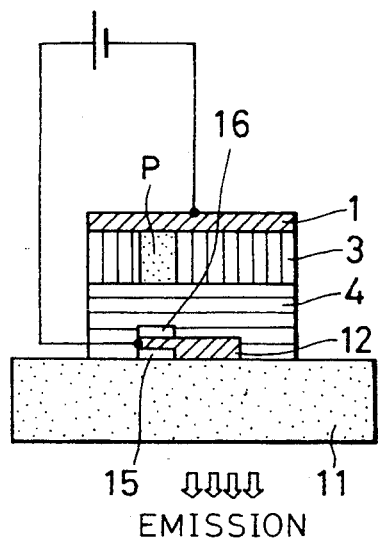
FIG. 9 is a schematic sectional representation of an EL device.

In view of such an electrode structure, as shown in FIG. 8, it may be assumed that an EL device is formed of a metal film line 15, a transparent anode 12, an organic positive-hole transport layer 4, an emitting layer 3 and a metallic cathode 1 which are laminated in sequence on a glass transparent substrate 11. The emission of the portion P shown in FIG. 8 is interrupted by the metal film line 15. The waste of electric current supplied to the portion P causes to deteriorate its emission efficiency. To overcome this problem, it is assumed that, as shown in FIG. 9, an insulation layer 16 obstructing electric current is formed on the transparent electrode 12 so as to prevent the portion P from emitting light. However, these measures increase the numbers of steps in a photolithography method. They further complicate manufacturing of the device by requiring troublesome alignment of a mask.

The present invention overcomes such a complication with the construction as shown in FIGS. 4–6 because the lower metal film line 7, with of a work function equal to or lower than that of the transparent electrode 2, is partly covered therewith. Namely, to partially cover the transparent electrode with the metal line achieves a simple process for the manufacturing of the EL device without the complicated construction of EL device as shown in FIG. 9.

(EXAMPLE 1)

A glass substrate on which line anodes with 2 mm width of ITO (work function=about 5.0 eV) have been formed at about 1000 angstroms in thickness, is prepared. The metal film of Al-Li alloy (work function=-about 3.0 eV) are formed at about 500 angstroms in thickness on the ITO anodes by means of a vacuum deposition method under the conditions of a pressure less than $10^{-5}$ Torr. A plurality of the metal film lines are then formed along the edges of the ITO anode lines respectively so that each metal line has 0.5 mm width by means of the photolithography method. Next, N,N'-diphenyl-N-N'-bis(3-methylphenyl)-1,1'-biphenyl-4,4'-diamine (hereinafter referred as "TPD") is deposited as an organic positive-hole transport layer on the pattern of the transparent electrodes and the metal film lines laminated on the substrate. Subsequently tris(8-quinolinol) aluminum (hereinafter referred as "$Al_{q3}$") is deposited on the TPD positive-hole transport as an organic emitting layer. Each functional layer has a thickness of about 500 angstroms. After that, a plurality of metallic cathode lines of Al-Li alloy is formed perpendicular to the ITO transparent electrodes respectively at about 1000 angstroms in thickness and 2 mm width by means of the photolithography method. EL devices each of 2 mm×2 mm area are manufactured as shown in FIG. 4.

Figure 10:
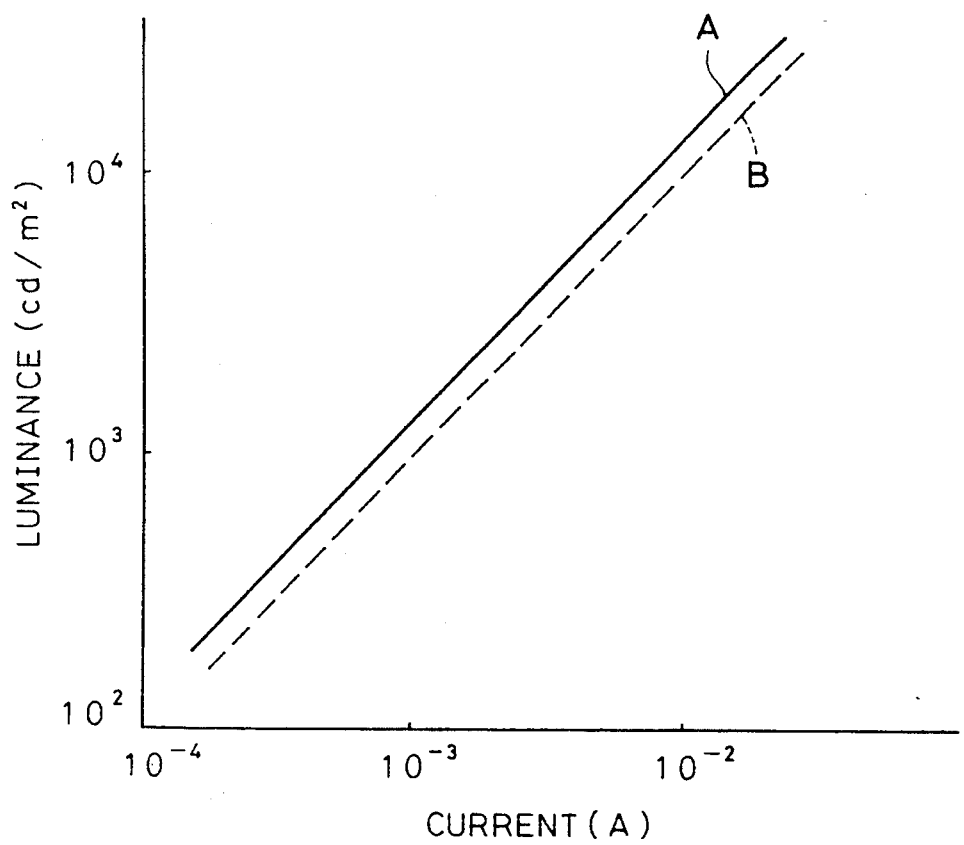
FIG. 10 is a graph showing electric current-luminance properties of an example according to the present invention and a comparative EL device.

The electric current-luminance property of the EL device is illustrated with the line an in the graph shown in FIG. 10. The dotted line B of FIG. 10 indicates the property of a comparative EL device manufactured under the same conditions of Example 1 except that the metal film lines are made of Pt (work function=about 5.65 eV) which has a work function higher than that of ITO. It is understood through the graph that the luminance efficiency of Example 1 is higher than that of the comparative EL device using the metal film line of the work function higher than that of ITO.

(EXAMPLE 2)

The present invention is adapted to a double matrix construction of transparent electrodes as Example 2.

Figure 11A:
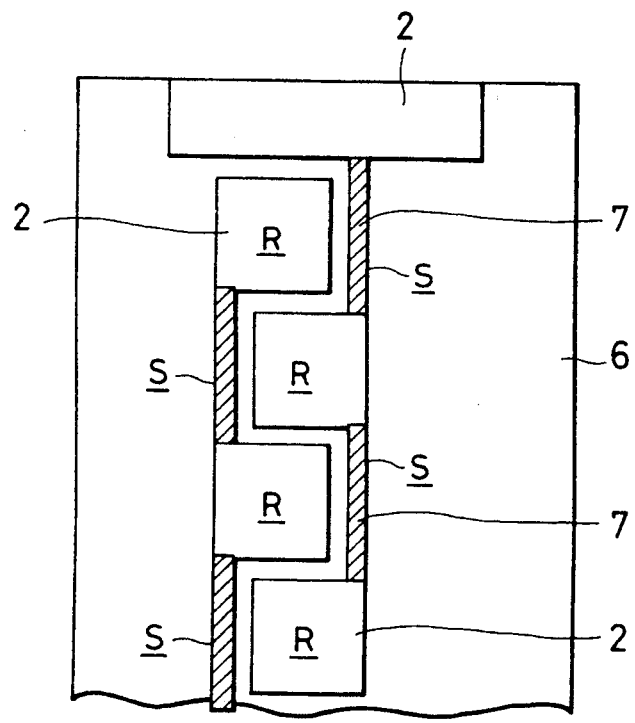
FIGS. 11A and 11B are plan views of substrates in the manufacturing process for Example 3 according to the present invention of a double matrix structure of the EL device.

FIG. 11A shows a plan view of a glass substrate 6 in which each ITO transparent electrode 2 is formed on the substrate 6 through the photolithography method in the form of a bridged islands shape. This shape comprises an island portion R and an intermediate bridge portion S bridging between the island portions so that a pair of electrodes are spaced and face each other with a complementary arrangement. The metal film lines 7 of Al-Li alloy are partially laminated intermittently on the bridge portions S of ITO transparent electrodes 2 at about 500 angstroms in thickness using a vacuum deposition method under the conditions of less than $10^{-5}$ Torr and the photolithography method.

Figure 11B:
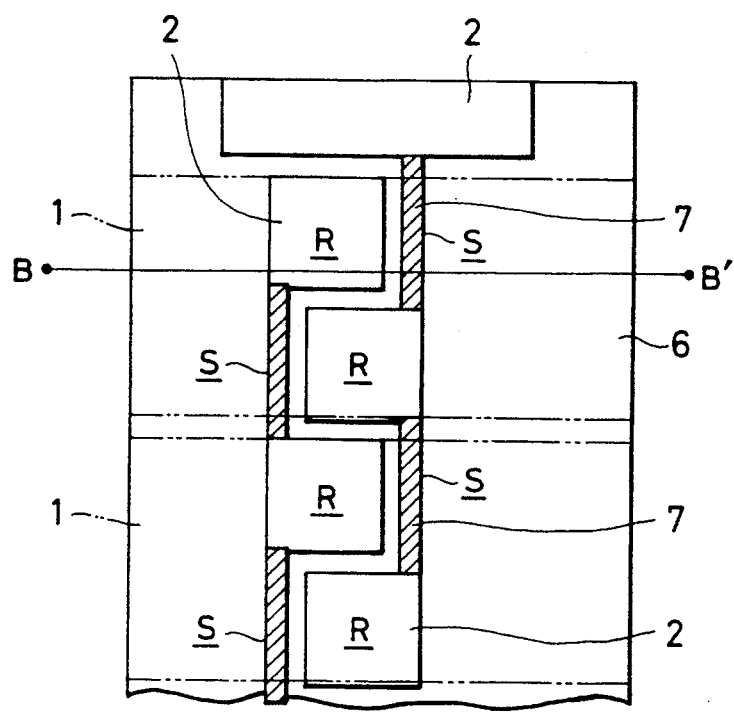
Figure 12:
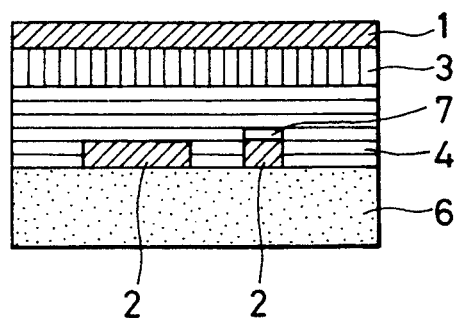
FIG. 12 is a schematic sectional representation of an EL device taken along line BB' in FIG. 11B.

Next, a TPD organic positive-hole transport layer and an $Al_{q3}$ organic emitting layer are laminated in sequence on the pattern of the transparent anodes and the metal film lines all over at about 500 angstroms in thickness respectively. Then, as shown in FIG. 11B, a plurality of metallic cathode lines of Al-Li alloy (two dotted line) are formed on the $Al_{q3}$ organic emitting layer perpendicular to the ITO transparent electrodes respectively at about 1000 angstroms in thickness. These cathode lines are formed in such a manner that each cathode crosses a pair of complementary island portions R of adjacent different anodes. In this way, the double matrix EL device is manufactured. FIG. 12 shows a schematic sectional representation of the EL device partially cut along the line BB' in FIG. 11B.

With this manufactured EL device, the line resistance value of the total anode of the ITO electrodes and the metal film lines on the substrate are measured, to obtain the resistance value=about 0.5 KΩ.

A comparative EL device is manufactured under the same conditions of Example 2 except that the metal film lines of Al-Li alloy are not formed between the ITO anode and the TPD organic positive-hole transport layer. Its ITO electrodes on the substrate are also measured for resistance value. As a result, the resistance value of the ITO electrode is about 4.4 KΩ. Example 2 has a resistance value remarkably lower than that of the comparative EL device.

When the EL device of Example 2 is driven upon application at about 10 V, the island portions R emit green light but the intermediate portions S shown in FIG. 11B do not emit. The electric current value of the intermediate portions S shown in FIG. 11B is only 1/1000 of that of the island portions R.

(EXAMPLE 3)

Figure 13:
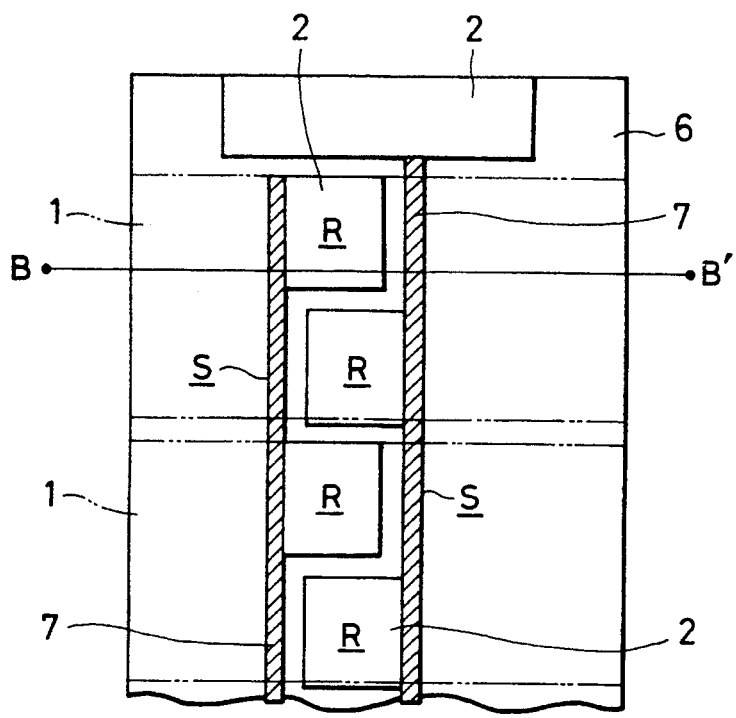
FIG. 13 is a plan view of Example 3 of an EL device according to the present invention showing another double matrix structure thereof.
Figure 14:
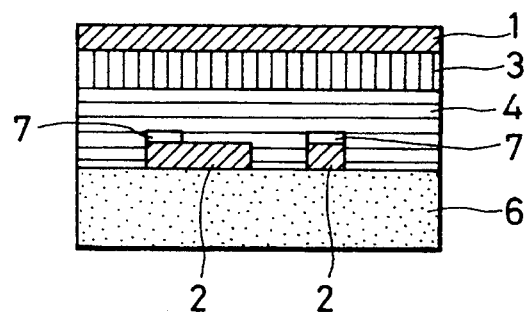
FIG. 14 is a schematic sectional representation of the EL device taken along line BB' in FIG. 13.

As shown in FIG. 13, an EL device of Example 3 is manufactured under the same conditions of Example 2 except that the metal film lines 7 are partially and continuously laminated on the bridge portions S and the edge of the island portions R in the extending direction. FIG. 14 shows a schematic sectional representation of the EL device partially cut along the line BB' in FIG. 13.

The line resistance value of the total anode of the ITO electrodes and the metal film lines on the substrate are measured with respect to the manufactured device. We have obtained the resistance value=about 160 KΩ. Since the comparative EL device above mentioned has the resistance value of 4.4 KΩ, Example 3 has a resistance value lower than that of the comparative EL device.

When the EL device of Example 3 is also driven upon application at about 10 V, the island portions R emit green light but the intermediate portions S shown in FIG. 13 do not emit light. The electric current value of the intermediate portions S shown in FIG. 13 is only 1/1000 of that of the island portions R.

These embodiments of the EL device are formed in a two-layer structure in which the fluorescent emission layer 3 and the positive-hole transport layer 4 are arranged between the metal cathode 1 and the transparent anode 2 with the metal film 7 as shown FIG. 4. Furthermore, an EL device shown FIG. 5, having the three-layer structure, i.e., an organic electron transport layer 5, an organic fluorescent film 3 and an organic positive-hole transport layer 4 being laminated in sequence between a cathode 1 and an anode 2 with a metal film 7, is manufactured in the same conditions as examples above mentioned. In this case the electron transport layer 5 of organic EL device is preferably made of 2-(4'-tert-butylphenyl)-5-(biphenyl)-1,3,4-oxadiazole (it's so called t-Bu-PBD). This three-layer type EL device also achieves substantially the same advantageous effect as the examples above mentioned.

As described above, the organic EL device according to the present invention having a cathode, an organic emitting layer, an organic hole transport layer and an anode which are laminated in sequence, is characterized in that a metal film having a work function equal to or lower than that of the anode is partially disposed between the anode and the positive-hole transport layer the emitting layer. Because of this EL device construction, an EL device of a high luminance efficiency is obtained which comprises a substrate with anodes of a low line resistance value. Additionally, the manufacturing process of the EL device is facilitated. Furthermore, the EL device emits light at a high luminance upon application of a low voltage.

What is claimed is:

1. An organic electroluminescent device comprising:
 a substrate;
 an anode having a high work function and disposed on said substrate for injecting positive-holes;
 a metal film having a work function equal to or lower than that of the anode and partially disposed on said anode for partially suppressing the injection of positive-holes from said anode;
 a positive-hole transport layer comprising an organic compound directly disposed on said anode and said metal film for transporting positive holes;
 an emitting layer comprising an organic compound disposed on said positive-hole transport layer wherein positive-holes transported from said anode through said positive-hole transport layer combine with electrons for generating visible light; and
 a cathode having a low work function and disposed on said emitting layer for injecting electrons to the emitting layer;
 wherein said metal film partially reduces electric current supplied to said emitting layer so that a portion of said emitting layer between said metal film and said cathode hardly emits light while reducing a resistance value of the whole anode consisting of said anode and said metal film to improve a luminance efficiency.

2. An organic electroluminescent device according to claim 1, further comprising an organic electron transport layer comprising an organic compound and arranged between said cathode and said emitting layer.

3. An organic electroluminescent device according to claim 1, wherein said metal film is intermittently formed on said anode in the extending direction thereof.

4. An organic electroluminescent device according to claim 1, wherein said metal film is continuously formed on said anode in the extending direction thereof.

5. An organic electroluminescent device according to claim 1, wherein said anode comprises island portions and intermediate portions bridging between said island portions in the extending direction thereof, and at least a portion of said metal film being disposed on said intermediate portions.

6. An organic electroluminescent device according to claim 1, further comprising a second metal film inserted between said metal film and said anode for improving at least one of adhesiveness and affinity therebetween.

* * * * *